(12) United States Patent
Thurgate

(10) Patent No.: US 6,417,081 B1
(45) Date of Patent: Jul. 9, 2002

(54) PROCESS FOR REDUCTION OF CAPACITANCE OF A BITLINE FOR A NON-VOLATILE MEMORY CELL

(75) Inventor: Timothy J. Thurgate, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/721,066

(22) Filed: Nov. 22, 2000

Related U.S. Application Data

(60) Provisional application No. 60/204,470, filed on May 16, 2000.

(51) Int. Cl.$^7$ .............................................. H01L 21/425
(52) U.S. Cl. ...................................................... 438/526
(58) Field of Search ............................... 438/261, 262, 438/263, 264, 265, 526, 527

(56) References Cited

U.S. PATENT DOCUMENTS

| | | | | |
|---|---|---|---|---|
| 5,084,418 A | * | 1/1992 | Esquivel et al. | |
| 5,635,415 A | * | 6/1997 | Hong | ......................... 438/261 |
| 6,137,728 A | * | 10/2000 | Peng et al. | |

OTHER PUBLICATIONS

Streetman, B.G.; "Solid State Electronic Devices," 1980, Prentice Hall, Second edition, pp. 204–206.*

* cited by examiner

*Primary Examiner*—Keith Christianson
(74) *Attorney, Agent, or Firm*—Amin & Turocy, LLP

(57) ABSTRACT

A process for forming an array of memory cells that includes forming a buried bitline region by implanting an n-type dopant in a region of a semiconductor substrate, wherein there is a severe differential change going from the bitline region to the substrate region causing the capacitance of a junction between the bitline region and the semiconductor to be large and reducing the capacitance of the junction.

15 Claims, 4 Drawing Sheets

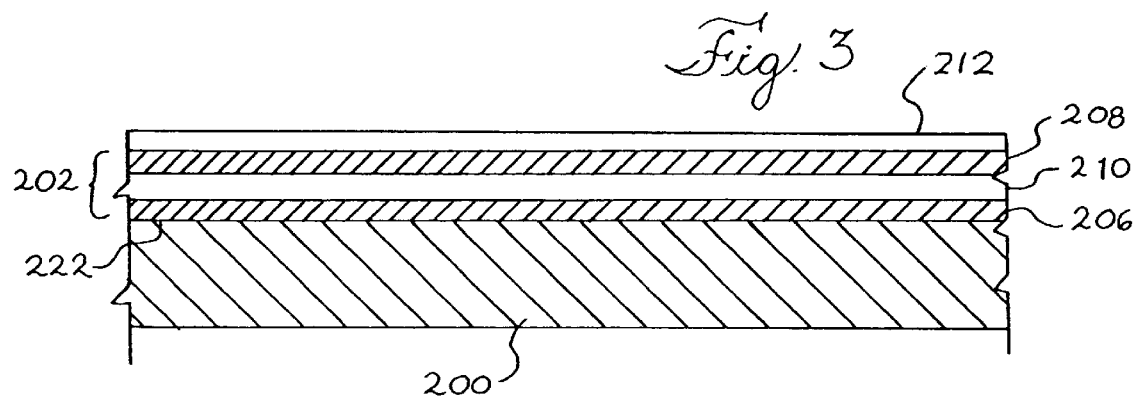
Fig. 3
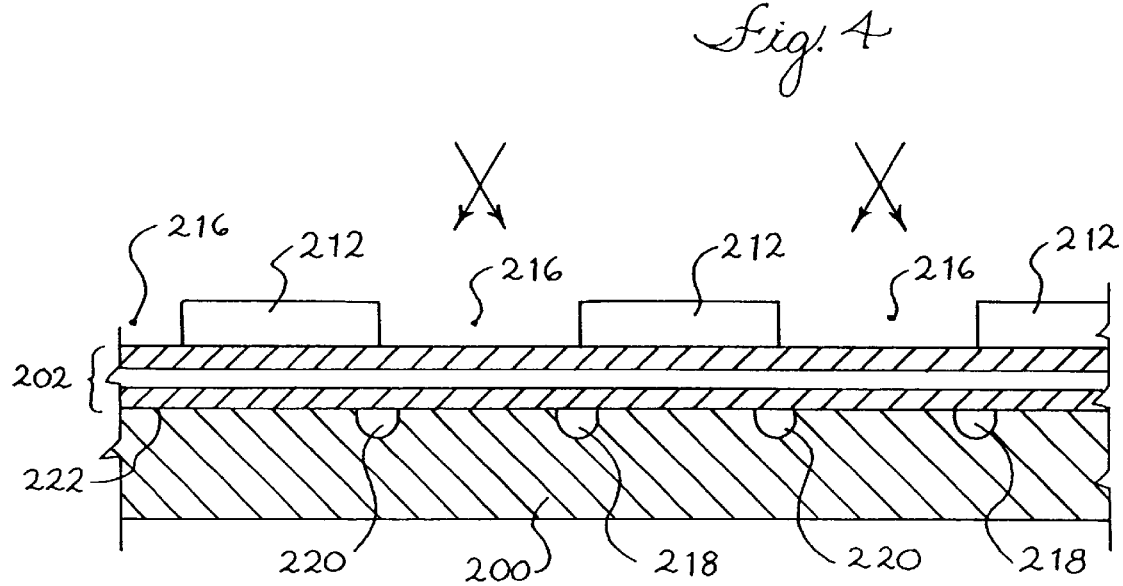
Fig. 4
Fig. 5
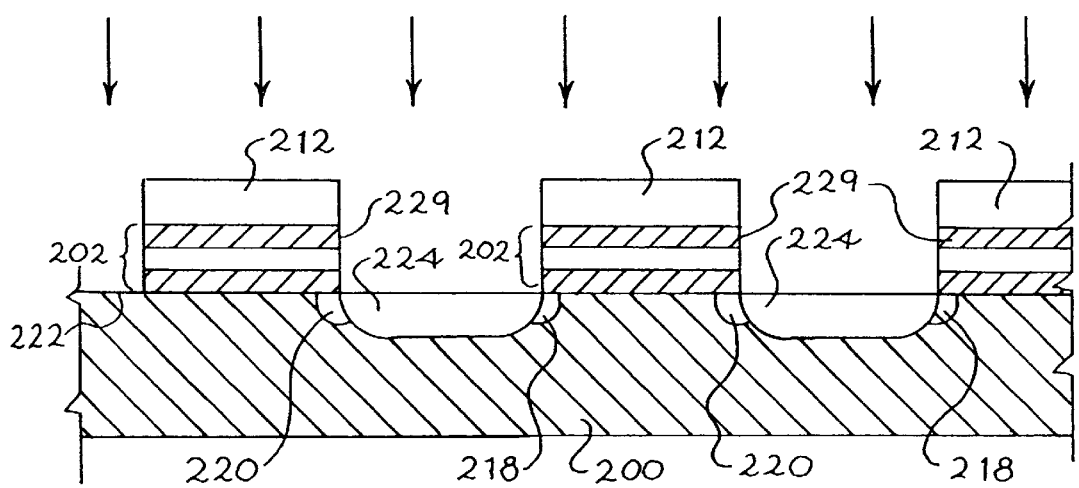

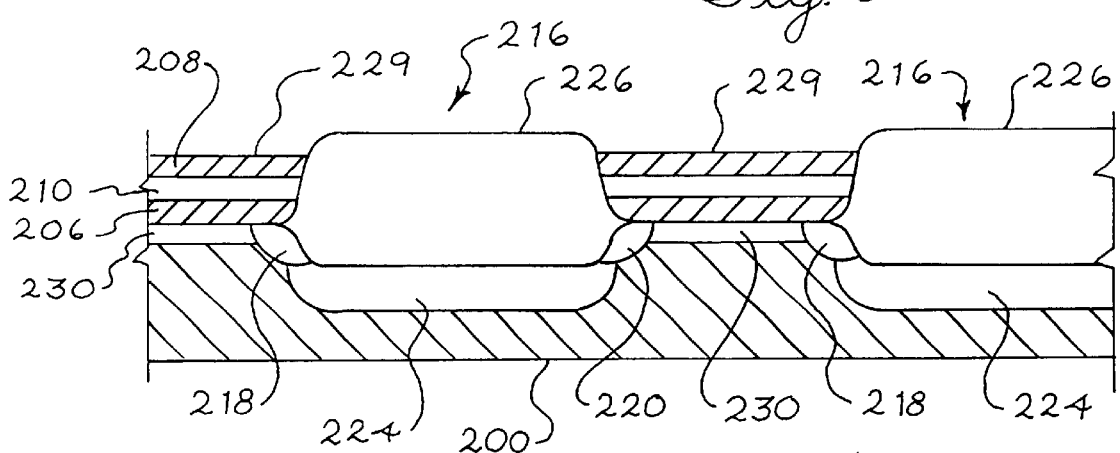
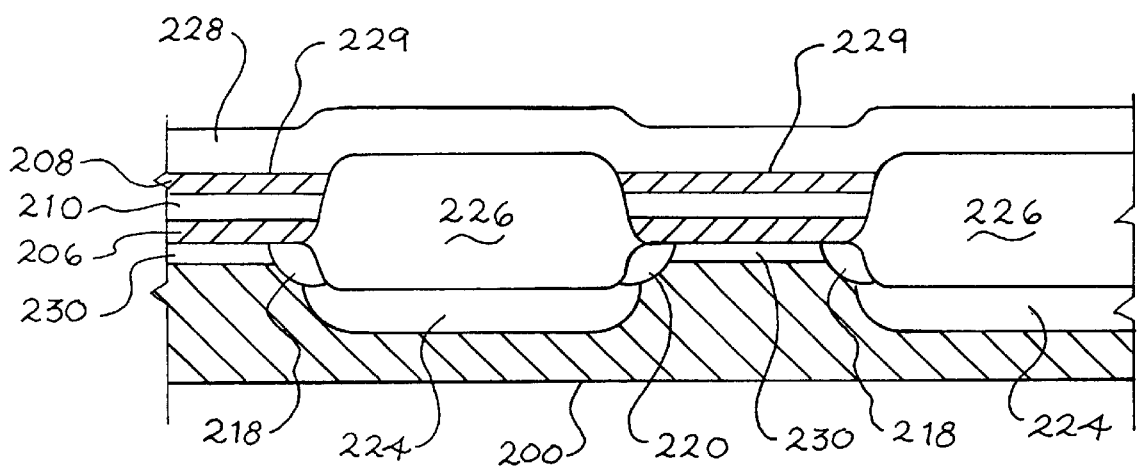

PROCESS FOR REDUCTION OF CAPACITANCE OF A BITLINE FOR A NON-VOLATILE MEMORY CELL

Applicant claims, under 35 U.S.C. §119(e), the benefit of priority of the filing date of May 16, 2000, of U.S. Provisional Patent Application Ser. No. 60/204,470, filed on the aforementioned date, the entire contents of which are incorporated herein by reference.

BACKGROUND OF THE INVENTION

1. Field of the Invention

The present invention relates to the field of non-volatile memory devices. More particularly, the invention relates to a multi-bit flash electrically erasable programmable read only memory (EEPROM) cell with a bitline.

2. Discussion of Related Art

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM.

An example of a single transistor Oxide-Nitrogen-Oxide (ONO) EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride oxide (ONO) layer of the device. Other examples of ONO EEPROM devices are disclosed in U.S. Pat. Nos. 5,635,415; 5,768,192 and PCT patent application publication WO 99/07000, the contents of each reference are hereby incorporated herein by reference.

In the case of known NROM devices, such as schematically shown in FIG. 1, an NROM cell 100 included a grid of polygates or word lines 102 and buried bitlines 104. The bitlines 104 were formed in the N+region of the substrate so that a higher density of bitlines can be formed that region versus when the bitlines were formed in a metal layer. As shown in FIG. 2, the junction formed between the buried bitlines 104 and the substrate had a severe differential change going from the bitline region to the substrate region which caused the capacitance of the junction to be large. It is well known that the higher the capacitance of the junction, the more the read speed is slowed down. Select transistors 106 were required to compensate for the high capacitance and the slowing of the read speed. The overall size of the flash memory cell array increases the more select transistors 106 that are employed in the array.

SUMMARY OF THE INVENTION

One aspect of the invention regards a process for forming an array of memory cells that includes forming a buried bitline region by implanting an n-type dopant in a region of a semiconductor substrate, wherein there is a severe differential change going from the bitline region to the substrate region causing the capacitance of a junction between the bitline region and the semiconductor to be large and reducing the capacitance of the junction.

The above aspect of the present invention provides the advantage of decreasing the junction capacitance and decreasing the number of select transistors needed in a memory cell array.

The above aspect of the present invention provides the advantage of reducing the total size of a memory array.

The present invention, together with attendant objects and advantages, will be best understood with reference to the detailed description below in connection with the attached drawings.

BRIEF DESCRIPTION OF THE DRAWINGS

FIGS. 3–9 illustrate side cross-sectional views of processing steps according to an embodiment of the present invention.

DETAILED DESCRIPTION OF THE INVENTION

Figure 1:
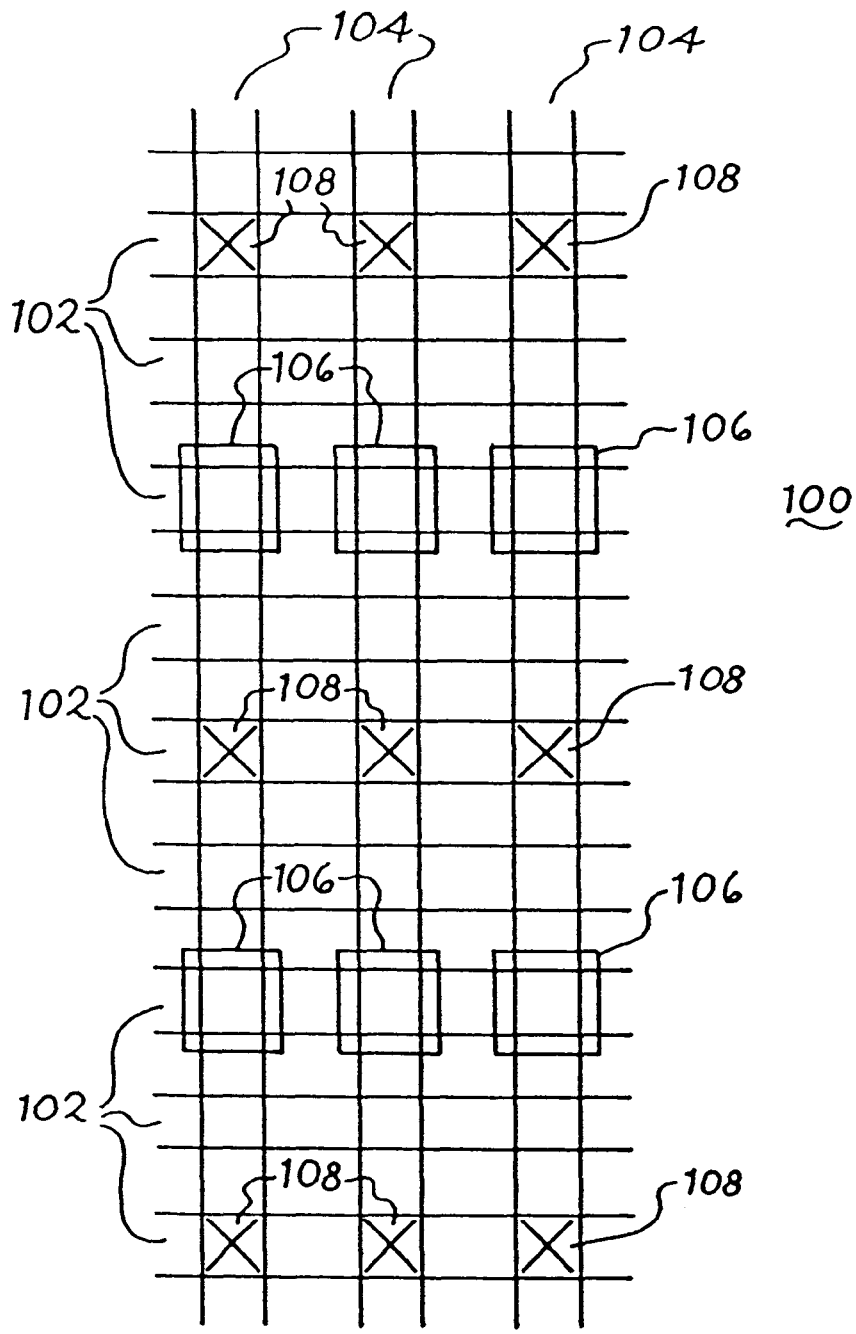
FIG. 1 illustrates a top cross-sectional view of a prior art NROM cell with a buried bit line.
Figure 2:
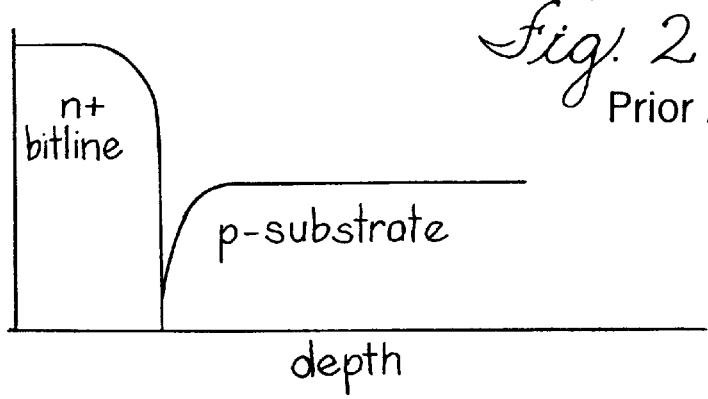
FIG. 2 illustrates a side cross-sectional view of the NROM cell of FIG. 1.

Non-volatile memory designers have taken advantage of the ability of silicon nitride to store charge in localized regions and have designed memory circuits that utilize two regions of stored charge within the ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

Two bit memory cells are typically accessed by buried bit-lines formed in a semiconductor substrate. A bit-line oxide layer is formed over the buried bit-line prior to forming a central gate electrode.

Shown in FIG. 3, in cross-section is a portion of a semiconductor substrate 200 having already undergone several processing steps. An ONO layer 202 overlies the semiconductor substrate 200 and includes a first oxide layer 206, a second oxide layer 208 and a silicon nitride layer 210 sandwiched between the first oxide layer 206 and the second oxide layer 208.

As shown in FIG. 3, a resist layer 212 is formed to overly the ONO layer 202. Resist layer 212 can be one of a number of different types of resist, including optical photoresist responsive to visible and near UV light, deep UV resist and the like. Alternatively, resist layer 212 can be an inorganic resist layer, an X-ray resist layer and the like. In a preferred embodiment, resist layer 212 is a Novolak resin photoresist material.

Resist layer 212 is exposed to radiation of the appropriate wavelength and developed to form a resist pattern overlying ONO layer 202, as illustrated in FIG. 4. Resist pattern 212 is formed to have a predetermined geometric configuration for the fabrication of buried bit-line regions in semiconductor substrate 200. Resist pattern 212 allows for exposing selected regions 216 of semiconductor substrate 200. Once resist pattern 212 is formed, an implantation process is carried out to form pocket regions 218, 220 in semiconductor substrate 200. Pocket regions 218, 220 are preferably formed by an angled ion implant process in which semiconductor-substrate 200 is held at an angle of about 7° to about 60°, typically 30° to 45°, with respect to normal during the ion implantation process. The angled ion implant process forms pocket regions 218, 220 in semiconductor substrate 200 in locations that partially underlie a portion of resist pattern 212. In a preferred embodiment, a p-type dopant, such as boron, is ion implanted into semiconductor substrate 200 to form pocket regions 218, 220. During the ion implantation process, the boron ions penetrate ONO layer 202 and enter semiconductor substrate 200 at an angle sufficient to create a boron pocket region that extends partially beneath resist pattern 212.

Referring to FIG. 5, after forming the pocket regions 218, 220, portions of ONO layer 202 exposed by resist pattern 212 are etched to expose principal surface 222 of semiconductor substrate 200. Preferably, resist pattern 212 is used as an etching mask, such that the etching process exposes principal surface 212 in selected regions 216 defined by resist mask 212. In a preferred embodiment, ONO layer 202 is anisotropically etched, such that ONO layer 202 and resist pattern 212 have continuous, substantially vertical sidewalls.

Once the etching process is complete, preferably an ion implantation process is carried out to form a buried bit-line region 224 in selected region 216 of semiconductor substrate 200. Preferably, an n-type dopant, such as arsenic, is ion implanted at an angle of incidence substantially normal to principal surface 222 of semiconductor substrate 200. Preferably, buried bit-line region 224 is formed by the ion implantation of arsenic using a dose of about $3 \times 10^{15}$ to about $5 \times 10^{15}$ ions per square centimeter. The ion implantation energy is selected so as to form buried bit-line region 224 to a selected junction depth in semiconductor substrate 200. Preferably, the ion implantation energy is of sufficient magnitude, such that the junction depth of buried bit-line region 224 is greater than the junction depth of pocket regions 218, 220. The junction formed between the buried bitlines 104 and the substrate has a severe differential change going from the bitline region to the substrate region which causes the capacitance of the junction to be large. As used herein, the term "junction depth" refers to the distance from the surface of the substrate to the deepest point of formation of a p/n junction associated with the implanted region within the substrate.

Those skilled in the art will recognize that other methods for forming the memory cell arrays are possible. For example, the order of formation of the pocket regions 218, 220 and the buried bit-line region 224 can be reversed from that described above. In an alternative embodiment, before etching ONO layer 202, an implant process can be carried out to form bit-line region 224, followed by an angled implant process to form pocket regions 218, 220. In yet another alternative, ONO layer 202 can be etched before either implant process is carried out.

Figure 6:
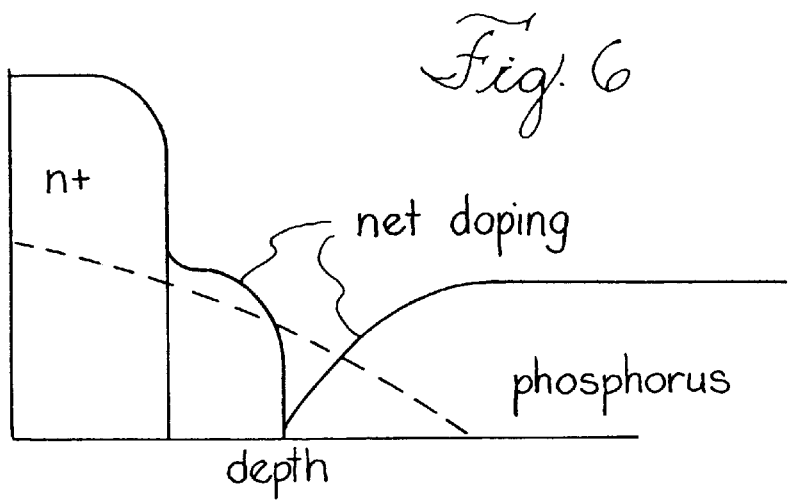

At the time of forming the buried bitline 224 of FIG. 5, a high energy, low dose of phosphorous is implanted into the center of the bitline 224 via a mask, for example. This implant partially compensates the substrate concentration and produces a graded function. The effect of this implant is shown by the concentration vs. depth graph of FIG. 6.

Figure 7:
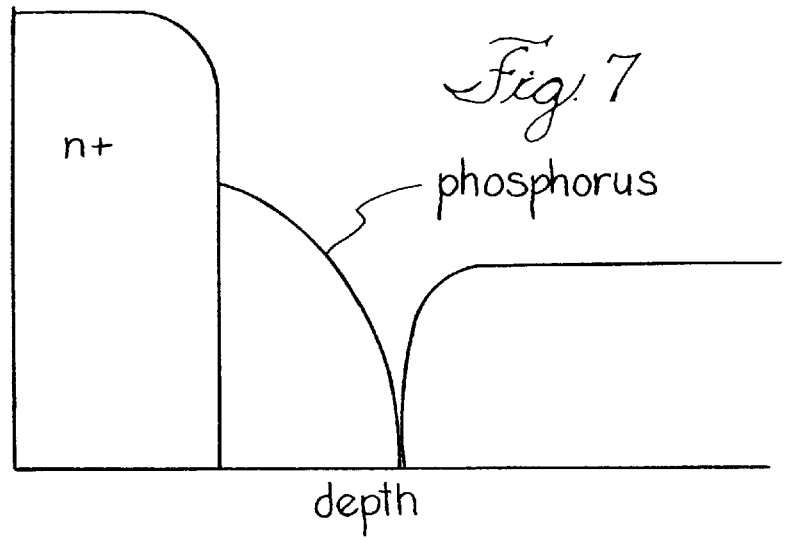

After the implant of the bitline 224 is complete, the substrate side of the junction is implanted with a lower energy and higher dose of phosphorous to grade the substrate side of the junction. The effect of this implant is shown by the concentration vs. depth graph of FIG. 7.

As illustrated in FIG. 8, the resist pattern 212 is removed and bit-line oxide regions 226 are formed. In a preferred embodiment, bit-line oxide layer 226 is formed by thermal oxidation of semiconductor substrate 200 using ONO layer 202 as an oxidation mask. ONO layer 202, having been previously patterned by the etching process described above, exposes selected regions 216 of semiconductor substrate 200. During the oxidation process, the patterned portions of ONO layer 202 prevent the oxidation of semiconductor substrate 200 in region underlying ONO layer 202. Accordingly, bit-line oxide layers 226 are confined to selected regions 216 of semiconductor substrate 200. Upon completion of the oxidation process, bit-line layers 226 overly buried bit-line regions 224 in semiconductor substrate 200.

In addition to the layers 226, control gate electrode contacts/electrodes 228 are formed over the floating gate electrodes 229 by depositing a layer of polycrystalline silicon by a CVD process, followed by patterning and etching to form thin control-gate lines overlying the substrate 200. As shown in FIG. 9, the electrode 228 overlies the layers 226 and bit line oxide regions 224.

Once the above-described process is complete, a two bit flash EEPROM cell is formed as shown in FIG. 9. The flash EEPROM memory cell includes an N+type substrate 200 having two buried PN junctions, one being between the source pocket 218 and substrate 200, termed the left junction and the other being between the drain pocket 220 and the substrate 200, termed the right junction. Above the channel 230 is an oxide layer 206 made of silicon dioxide. The oxide layer 206 has a thickness that is less than or equal to 60 Angstroms, and which forms an electrical isolation layer over the channel.

On top of the oxide layer 206 is a charge trapping layer 210 that has a thickness ranging from approximately 20 to 100 Angstroms and preferably is comprised of silicon nitride, $Si_3N_4$. The hot electrons are trapped as they are injected into the charge trapping layer so that the charge trapping layer serves as the memory retention layer.

The thickness of layer 210 is chosen to be in excess of approximately 50 Angstroms to prevent electrons from tunneling through the layer 206 and leaving charge trapping layer 210 during the operation of the cell. Thus, the lifetime of the cell of this invention is greatly extended relative to prior art NMOS devices. The memory cell is capable of storing two bits of data, a right bit and a left bit.

It is important to note that the two-bit memory cell is a symmetrical device. For example, the left junction serves as the source terminal and the right junction serves as the drain terminal for the right bit. Similarly, for the left bit, the right junction serves as the source terminal and the left junction serves as the drain terminal. Thus, the terms left, or first junction and right or second junction are used herein rather than source and drain. When the distinction between left and right bits is not crucial to the particular discussion, the terms source and drain are utilized. However, it should be understood that the source and drain terminals for the second bit are reversed compared to the source and drain terminals for the first bit.

A layer of silicon dioxide 208 is formed over the charge trapping layer, (i.e., silicon nitride layer), and has a thickness that ranges between approximately 60 to 100 Angstroms. The silicon dioxide layer 208 functions to electrically isolate a conductive gate 228 formed over the silicon dioxide layer 208 from charge trapping layer 210. The thickness of gate 228 is approximately 4,000 Angstroms. Gate 228 is constructed from an N-type material, such as polycrystalline silicon that is typically heavily doped with an N-type impurity such as phosphorous in the $10^{19}$ to $10^{20}$ atom/cc range.

The foregoing description is provided to illustrate the invention, and is not to be construed as a limitation. Numerous additions, substitutions and other changes can be made to the invention without departing from its scope as set forth in the appended claims.

I claim:

1. A process comprising:
    forming a buried bitline region by implanting an n-type dopant in a region of a semiconductor substrate, wherein there is a severe differential change going from the bitline region to the substrate region causing the capacitance of a junction between the bitline region and the semiconductor to be large; and
    reducing the capacitance of said junction.

2. The process of claim 1, wherein said reducing comprises grading said junction.

3. A process comprising:
    forming a buried bitline region by implanting an n-type dopant in a region of a semiconductor substrate, wherein there is a severe differential change going from the bitline region to the substrate region causing the capacitance of a junction between the bitline region and the semiconductor to be large;
    reducing the capacitance of said junction;
    said reducing comprising grading said junction; and
    said grading said junction comprising implanting a high energy, low dose of phosphorous into the center of the bitline region.

4. A process comprising:
    forming a buried bitline region by implanting an n-type dopant in a region of a semiconductor substrate, wherein there is a severe differential change going from the bitline region to the substrate region causing the capacitance of a junction between the bitline region and the semiconductor to be large;
    reducing the capacitance of said junction;
    said reducing comprising grading said junction; and
    said grading said junction comprising implanting phosphorous into the semiconductor substrate.

5. The process of claim 3, wherein the energy of phosphorous implanted into the semiconductor substrate is lower than the energy of the phosphorous implanted into said bitline region and the range of the dose of said phosphorous implanted into the semiconductor substrate is higher than the dose of the phosphorous implanted into said bitline region.

6. A process comprising:
    forming a buried bitline region by implanting an n-type dopant in a region of a semiconductor substrate, wherein there is a severe differential change going from the bitline region to the substrate region causing the capacitance of a junction between the bitline region and the semiconductor to be large;
    forming said semiconductor substrate to comprise a first region and a second region with a channel therebetween and a gate above said channel;
    forming a charge trapping region that contains a first amount of charge, and
    forming a layer positioned between said channel and said charge trapping region, wherein said layer has a thickness such that said first amount of charge is prevented from directly tunneling into said layer.

7. The process of claim 6, wherein said charge trapping region comprises silicon nitride.

8. The process of claim 6, wherein said gate comprises an N-type material.

9. The process of claim 8, wherein said gate comprises a polycrystalline silicon.

10. The process of claim 6, further comprising an insulating layer formed on and overlaying said charge trapping region.

11. The process of claim 10, where said insulating layer comprises silicon dioxide.

12. The process of claim 11, wherein said charge trapping region comprises silicon nitride.

13. The process of claim 6, wherein each of said plurality of memory cells comprises an EEPROM memory cell.

14. The process of claim 6, wherein each of said plurality of memory cells comprises a two-bit memory cell.

15. The process of claim 6, wherein said substrate comprises a P-type substrate.

* * * * *